United States Patent
Stocken

(10) Patent No.: US 7,272,757 B2
(45) Date of Patent: Sep. 18, 2007

(54) METHOD FOR TESTING A MEMORY CHIP AND TEST ARRANGEMENT

(75) Inventor: Christian Stocken, München (DE)

(73) Assignee: Infineon Technologies AG, Munich (DE)

( * ) Notice: Subject to any disclaimer, the term of this patent is extended or adjusted under 35 U.S.C. 154(b) by 218 days.

(21) Appl. No.: 11/116,197

(22) Filed: Apr. 28, 2005

(65) Prior Publication Data
US 2005/0251728 A1    Nov. 10, 2005

(30) Foreign Application Priority Data
Apr. 30, 2004    (DE)    ...................... 10 2004 021 267

(51) Int. Cl.
*G11C 21/00*    (2006.01)
(52) U.S. Cl. ...................... 714/718; 714/712; 714/719; 714/763; 365/201
(58) Field of Classification Search ................ 714/718, 714/712, 719, 763
See application file for complete search history.

(56) References Cited

U.S. PATENT DOCUMENTS

| | | | |
|---|---|---|---|
| 5,987,623 A * | 11/1999 | Ushida ......................... | 714/6 |
| 6,055,653 A | 4/2000 | LeBlanc et al. | |
| 6,178,526 B1 * | 1/2001 | Nguyen et al. ................ | 714/42 |
| 6,195,616 B1 | 2/2001 | Reed et al. | |
| 6,415,397 B1 * | 7/2002 | Co et al. ....................... | 714/42 |
| 6,467,053 B1 | 10/2002 | Connolly et al. | |
| 2004/0260987 A1 * | 12/2004 | Ohlhoff et al. .............. | 714/718 |
| 2005/0246594 A1 * | 11/2005 | Co et al. ....................... | 714/52 |

FOREIGN PATENT DOCUMENTS

| | | |
|---|---|---|
| WO | WO99/01871 A1 | 1/1999 |
| WO | WO 00/52487 A1 | 9/2000 |
| WO | WO 02/29824 A2 | 4/2002 |

* cited by examiner

*Primary Examiner*—Guy Lamarre
*Assistant Examiner*—Esaw T. Abraham
(74) *Attorney, Agent, or Firm*—Eschweiler & Associates, LLC

(57) ABSTRACT

A test arrangement with a test memory chip and a control device is provided. Error correction data are stored in the test memory chip with the aid of the control device. In the case of an error event, it is ascertained whether the error occurred on the error correction chip. If so, the memory controller compares the data stored in the error correction chip with the data of the auxiliary memory. The address of the error correction chip can be deduced from the address of the auxiliary memory, thereby enabling unambiguous addressing of a defective memory cell of the error correction chip.

17 Claims, 5 Drawing Sheets

METHOD FOR TESTING A MEMORY CHIP AND TEST ARRANGEMENT

REFERENCE TO RELATED APPLICATIONS

This application claims the benefit of the priority date of German application DE 10 2004 021 267.8, filed on Apr. 30, 2004, the contents of which are herein incorporated by reference in their entirety.

FIELD OF THE INVENTION

The invention relates to a method for testing a memory chip and to a test arrangement for the error analysis of at least one memory chip of a memory.

BACKGROUND OF THE INVENTION

A volatile main memory for computer systems, which is referred to in shortened form as RAM memory module, is of great importance in modern computer systems. Advancing technology and the simultaneous fall in prices permit the use of memory modules with a multiplicity of individual memory chips fitted thereon up to a total capacity of 2 GB even in small personal computer systems. Larger storage capacities are continually being developed. In this context, the importance of test sequences and test methods for discovering possible errors is increasing since a failure on account of a hardware fault or else a design error, due to the high complexity of the memory chips used, cannot be ruled out from the outset in the design phase.

The multiplicity of computer programs and different applications generate data combinations and variants of access to the individual memory chips within the memory module that cannot be completely covered in the tests used for development or for production.

FIG. 3 shows a typical memory module such as is used in present-day computer systems, inter alia for servers and desktop systems and also for private personal computers. In this case, eight individual memory chips B1 to B8 are arranged on the memory module 1, said memory chips for their part containing a multiplicity of memory cells. The total number of memory cells in each memory chip yields the capacity of the individual memory chip. This is, by way of example, 8 MB, 16 MB or even 64 MB per memory chip. Each of said memory chips B1 to B8 is assigned a number of the pins P1 to P92 of the module 1. By means of corresponding signals on said pins, individual memory cells of the memory chips B1 to B8 are addressable, and data can be written to or read from the latter. A current and voltage supply for the memory chips B1 to B8 is likewise ensured.

The data required for a correct driving of the memory module by a memory controller are stored in a small auxiliary memory E1, which is referred to as an EEPROM or SPD-ROM. The data are read out by the memory controller prior to operation. The data stored in the ROM relate inter alia to the latencies of the individual memory chips, the burst rate and the read and memory access.

In order to avoid read errors in the memory cells of the individual memory chips, a further chip ECC is additionally provided on the memory module 1. Correction data are stored by the memory controller in this memory chip, which may indeed be the same type as the memory chips B1 to B8. With the aid of said correction data, the memory controller is able not only to detect a possible error in a memory cell of one of the eight memory chips B1 to B8 and communicate this to a processor of the computer system, but possibly also to correct the error. The additional chip ECC is also referred to as an error correction chip. It stores in its memory cells so-called check bits, which are used for detection of an error and correction thereof in one of the other memory chips. Various algorithms can be used for the generation of suitable check bits and the subsequent associated error correction methods. However, said algorithms can greatly influence the speed of the overall system and in particular of read and write processes in the memory and are therefore not usually published by the manufacturers of the memory controllers.

In a typical application example, the memory controller determines a checksum comprising 8 check bits from a total of 64 bits to be written to the memory chips B1 to B8 and then writes the total quantity of 72 bits to the memory module. The 8 check bits or checksum bits are written to the error correction chip ECC. When the memory cells of the chips B1 to B8 are subsequently read, the memory controller generates a checksum from the bits read and compares said checksum with the checksum from the error correction memory. The fact of whether one of the memory cells of the memory chips B1 to B8 is defective is determined in this case. If appropriate, the erroneous bit is corrected.

If an error occurs, the memory controller reports an error, an "ECC fail event", to a main processor of the computer system. In the case of such a message, however, it is not possible for the processor or a test program to ascertain whether the error occurred within the memory cell of one of the memory chips B1 to B8 or within the correction memory chip ECC. A defective memory cell within one of the memory chips B1 to B8 can be determined by a comparison of the data read from the chips with reference data. Since the memory controller also returns the precise address of the respective memory cell within the memory chip, it is thus possible to determine the precise location of the defective memory cell within the memory chip.

In contrast to this, the memory addresses of the checksum in the error correction chip ECC are not reported further by the memory controller. Therefore, in the case of an error within a memory cell of the error correction memory ECC, the defective memory cell has to be determined by means of other methods.

One method would be, for example, to detach the defective error correction chip ECC from the memory module 1 and test it separately. In practice, however, it proves to be difficult to simulate and precisely identify the errors that occurred in practical application within the test system. This results from ignorance of the algorithm used for the generation of error correction data of a memory controller. During a test within a test system, both static and dynamic errors occur, which can be assigned to the specific error only with difficulty.

FIG. 5 shows another possibility. In this case, a test card TI is connected between the actual memory controller C in a computer system and the memory module 1 with a total of three memory chips B1, ECC and B2. The memory chip ECC forms the error correction chip and is provided, in a normal operating mode, when the memory module 1 is directly connected to the control circuit C, for receiving and outputting error correction data. When an ECC fail event occurs, the test card TI is incorporated between memory module 1 and control circuit C. This is done whenever the ECC fail event has been caused on account of an error on the error correction chip ECC. The test card is configured in such that a way that it directly routes through the corresponding data and signal lines from the control circuit C for the memory chip B1. The test card TI leads the control line S1, the data line D1 and also the supply line V1 directly from the control circuit C to the memory module 1 and the associated memory chip B1.

At the same time, the control lines and the data lines for the error correction memory chip ECC and the second memory chip B2 are interchanged. As a result, the error correction data from the memory controller C are not written to the error correction memory ECC actually provided therefor, but rather to the second memory chip B2. At the same time, data provided for the memory chip B2 are written to the error correction chip ECC. Since the addresses for the data are output on the lines S3 and D3 by the controller C, it is thus possible to precisely determine the defective memory cell of the error correction memory chip ECC.

In this case as well, however, the data which a memory controller writes to the error correction memory are not known in advance. In particular, in the case of this design, different data are written to the error correction memory ECC than is the case in a normal operating mode. As a result, an error that depends on the data content of the memory cells or electrical parameters might no longer be demonstrable.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The invention is directed to a method for testing a memory chip used for error correction which enables a precise identification of an error address. Moreover, the invention is further directed to an arrangement which enables a rapid identification of a defective memory cell in a simple fashion.

Thus, in the case of the method according to the invention, provision is made of a memory with a memory chip comprising a multiplicity of readable and writable memory cells. The readable and writable memory cells of the memory chip are addressable. Furthermore, the memory of the memory module is configured to receive error correction data in an operating mode of the memory module. According to the invention, provision is made for a test memory having a multiplicity of readable and writable memory cells. Error correction data are then written to the memory chip and also, in parallel therewith, to the test memory chip. Consequently, the same data are stored in the memory chip of the memory module that is provided for the error correction and the test memory chip. A defective memory cell of the memory chip provided on the memory module is determined by comparing the data content of the memory cells of the memory chip with the data contents of the memory cells of the test memory chip.

This is done, in one advantageous embodiment, by identifying an address of a memory cell of the test memory chip whose data content deviates from the memory cell of the memory chip of the memory module that is provided for the error correction. The address of the memory cell of the memory chip provided for the error correction can be inferred from the address of the memory cell of the test memory chip.

As a result, in a manner similar to that in a normal operating mode, error correction data are written to the memory chip of the memory module that is provided for the error correction data. In particular, all dynamic and static conditions are thus identical during both a normal operating mode and a test operating mode for the error correction memory. Dynamic errors which occur in an operating mode in the error correction data occur sporadically and depending on the error correction data can be identified unambiguously such that they occur only in the error correction memory, but not in the test memory chip.

Preferably, the step of providing a memory module in this case also comprises providing a memory controller for addressing memory cells in the memory chip of the memory module that is provided for the error correction. Furthermore, data contents are written to and also read from addressed memory cells of the memory module by the memory controller. In this case, the memory controller is coupled to the memory module.

For writing error correction data to the memory chip provided for the error correction data and also the test memory chip, a memory cell of the memory chip provided for the error correction data is addressed. A memory cell of the test memory chip is also addressed with the same address. An error correction datum is then written to the addressed memory cell of the memory chip provided for the error correction data and to the test memory chip. Since the addresses of the memory chip and of the test memory chip are identical or can be derived in identical fashion for this error correction datum, it is possible, upon occurrence of an error event in the error correction data, by means of a subsequent comparison of the individual memory cells of the memory chip and of the test memory chip, to infer from the address of the test memory chip the assigned address of the memory chip of the memory module that is provided for the error correction data.

In one embodiment of the method, the address of a memory cell in the test memory chip for an error correction datum is derived from an address of a memory cell of the memory chip of the memory module that is provided for the error correction data.

In one embodiment of the invention, the step of determining a defective memory cell comprises addressing a first memory cell in the memory chip provided for the error correction data in the memory module and also addressing an associated memory cell in the test chip. Preferably, the two addresses of the respective memory cell in the test memory chip and in the memory chip are identical or can be derived from one another. The error correction datum is then read from the first memory cell and the assigned memory cell of the test memory chip and compared with one another. If the result is a respective different datum and thus a difference in the comparison, then there is a possible error in the memory cell of the memory chip provided for the error correction data. It is then possible to employ further analysis methods in order to determine the reason for and the constitution of the error more precisely. In particular, it is possible, using the now known address of the defective memory cell within the memory chip of the module that is provided for the error correction, to determine the geometry and the location of the memory cell in order possibly to draw conclusions about the error from this. The method is preferably carried out until an error has been found.

In another embodiment of the invention, the method comprises the steps of providing a memory with at least one memory chip with a multiplicity of readable and writable memory cells. The latter are addressable. Furthermore, a memory chip that is provided for error correction data and has a multiplicity of readable, writable and addressable memory cells is provided in the memory module. Furthermore, provision is made of a memory controller for addressing memory cells in the at least one memory chip and in the memory chip provided for the error correction data. This is used for reading and writing data contents to addressed memory cells of the at least one memory chip and of the memory chip of the memory module that is provided for the error correction data. The memory module is finally coupled to the memory controller.

Preferably, data are then written to memory cells of the at least one memory chip and of the memory chip provided for the error correction data. This embodiment of the invention makes it possible to detect even errors that occur dynamically and in a manner dependent on data contents within the memory chip provided for the error correction data and to identify an unambiguous addressing of the defective memory cells or the precise location of the error by means of the address thereof. This is possible in the course of operation of a test program that is situated in another memory module and is executed on the computer, and may be effected for example not only in a special test mode with special test data but also with normal application or program data. As a result, it is possible to map realistic scenarios and to react in a customized manner to problems that occur.

A test arrangement according to the invention for an error analysis of a memory chip provided for error correction data within a memory module comprises a first interface, which is designed for incorporation into a memory module slot of a computer system. Furthermore, the test arrangement contains a second interface, which is designed for receiving a memory module with a first memory chip and at least one second memory chip with, in each case, a multiplicity of addressable readable and writable memory cells. A connection-correct coupling between the first and the second interface is furthermore provided. According to the invention, a test memory chip with a multiplicity of addressable readable and writable memory cells and also a control device are provided. The control device is coupled to the test memory chip and to the second interface. According to the invention, the test arrangement can assume a first and at least one second operating state. In the first operating state, the test arrangement is designed, during a process of writing a datum in a memory cell of the first memory chip, for storage of the datum in a memory cell of the test memory chip. During a process of reading a datum from a memory cell of the first memory chip in the first operating state, the test arrangement is designed for suppressing a process of reading the datum from the memory cell of the test chip. In the second operating state, the test arrangement is designed for a comparison of a datum from a memory cell of the first memory chip with a datum from a memory cell of the test memory chip.

The test arrangement according to the invention for testing the functionality of a memory chip provided for error correction data in a memory module forms a device that enables a communication of a memory controller of a computer system with a memory module. The test arrangement according to the invention is connected to the computer system by its first interface and to the memory module by the second interface. A communication is effected via the test arrangement in such a way that error correction data are stored both in memory cells of the first memory chip and in memory cells of the test memory chip. A corresponding control is expediently effected by means of the control device.

In one embodiment, during a read process, however, the control device then only forwards data from the memory cells of the first memory chip of the memory module to the second interface. Data from the test memory chip are not forwarded. The second operating mode constitutes a test mode according to the invention, in which individual data from the memory cells of the first memory chip are compared with corresponding data from the memory cells of the test memory chip by means of the control device. In a suitable manner, the test arrangement is thus designed for determining a defective memory cell of the first memory chip.

The test arrangement according to the invention enables extensive realistic test scenarios in the course of operation of a computer system. The control device monitors and controls the signal flow between the first and second interfaces in a suitable manner, so that an erroneous operation is avoided.

In one embodiment of the invention, the test arrangement is realized on a plug-in card. In this case, all elements, in particular the interfaces, the test memory chip and the control circuit are arranged on the card. A test card is thereby formed.

In another embodiment, the test arrangement comprises at least one signal line by which at least one connection pin of the first interface is coupled to at least one corresponding connection pin of the second interface for driving the first memory chip. Preferably, a plurality of signal lines are provided which in each case connect a connection pin of the first interface to the respective connection pin of the second interface. Through these signal lines, signals at the connection pins of the first interface are passed through to the corresponding pins of the second interface.

In one preferred embodiment, the first and also the second interface are designed for supplying error correction data. In particular, the corresponding connection pins for supplying error correction data of the first interface are coupled to the corresponding connection pins of the second interface.

In one embodiment of the invention, the test memory chip is coupled to the second interface in disconnectable fashion via a first switching device, which can be controlled by the control device. As a result, the test memory chip can preferably be disconnected from the corresponding signal lines and thus also from the second interface. This embodiment is particularly expedient during a read process in a normal operating mode since an erroneous read-out of error correction data is thus avoided. In one development of the invention, the test memory chip is coupled to the at least one signal line, the at least one signal line being provided for an exchange of error correction data between the first interface and the second interface and thus between the memory controller of a computer system and the memory chip of the memory module that is provided for error correction data.

In one example, the first switching device is configured, in the first operating state of the control device, during a write process, to connect the test memory chip to the second interface and, during a read process in the first operating state, interrupt the connection of the test memory chip to the first interface. For this purpose, the switching device preferably contains a control input connected to the control device. Consequently, during a read process, the first switching device disconnects the test memory chip from the second interface and connects this to the second interface during a write process for error correction data.

In another embodiment of the invention, a second switching device is provided, which can be controlled by the control device and is connected between the first and the second interface. Preferably, the second switching device is configured, in the first operating state, to connect the first interface to the second interface and, in the second operating state, interrupt the first interface with the second interface. What is thereby achieved is that, in the second operating state, a memory control device connected to the first interface does not receive any signals and the control device of the test arrangement can be put into the second operating state in a manner free of errors.

In yet another embodiment of the invention, the control device is connected to a control signal line for the purpose of evaluating a read and write process. This advantageously enables the control device to monitor a control of a read and write process in order thus, if appropriate, to suitably switch the first and second switching devices in the first operating state.

In this example, the control signal line couples the first interface to the second interface and preferably couples a connection pin of the first interface to the corresponding connection pin of the second interface. In a further embodiment of the invention, a third switching device is provided, via which the control device is coupled to the second interface. In this case, the third switching device is designed as a switching device that can be regulated by the control device. Preferably, the third switching device, in the first operating state, interrupts a connection between the control device and the second interface and, in the second operating state, enables a connection of the control device to the second interface. The connection of the control device to the second interface in the second operating state enables a read-out from memory cells of the first memory chip of the memory module with the aid of corresponding signals of the control device.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in detail below on the basis of an exemplary embodiment with reference to the drawings, in which.

DETAILED DESCRIPTION OF THE INVENTION

Figure 3:
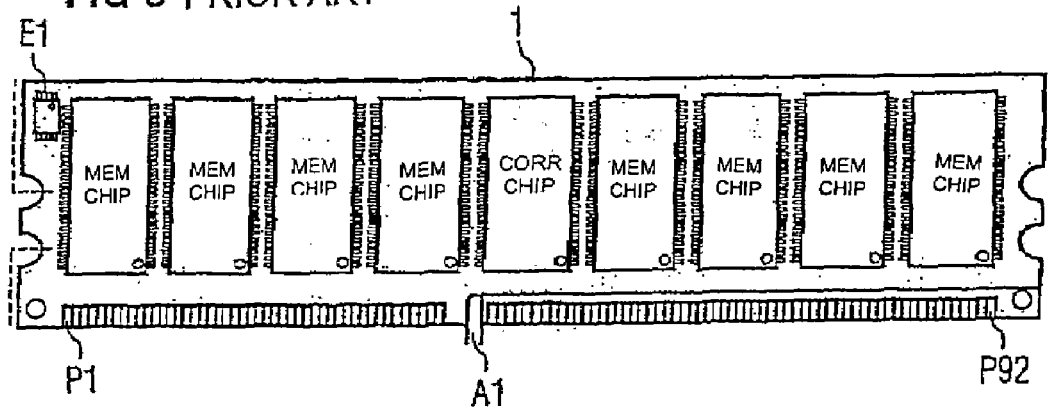
FIG. 3 is a prior art plan view of a memory module with a plurality of memory chips.

FIG. 3 shows a known exemplary embodiment of a memory module 1 that is inserted into a memory module slot of a computer system. A memory controller arranged within the computer system (not illustrated here) serves for control and also for addressing of memory cells to which data can be written or from which data can be read. For this purpose, the memory module 1 has a plurality of individual memory chips B1 to B8 which, for their part, contain a multiplicity or plurality of different memory cells.

Each of said memory chips B1 to B8 is for its part connected to a number of pins P1 to P92. In this case, some of said pins carry address signals for addressing individual memory cells within one of the memory chips B1 to B8, while others serve for supply with a supply current or a supply voltage. Further pins are provided as data lines that carry the content of memory cells from the memory chips.

The memory controller, which is not illustrated for reasons of clarity, controls and monitors the individual memory chips B1 to B8 on the memory module 1. In particular, it is able to address individual memory cells on a memory chip, to read out the corresponding data and to feed them to a processor or further components of the computer system for data processing. It likewise drives individual memory cells in the memory chips B1 to B8 in a suitable manner in order thus to store data transferred from the processor or other components of the computer system in the memory chip. An access to individual memory cells within a memory chip of the module 1 is effected by means of emitting corresponding address signals on the pins assigned to the chip. A successful addressing is followed by a read-out of the activated memory cells.

Figure 6:
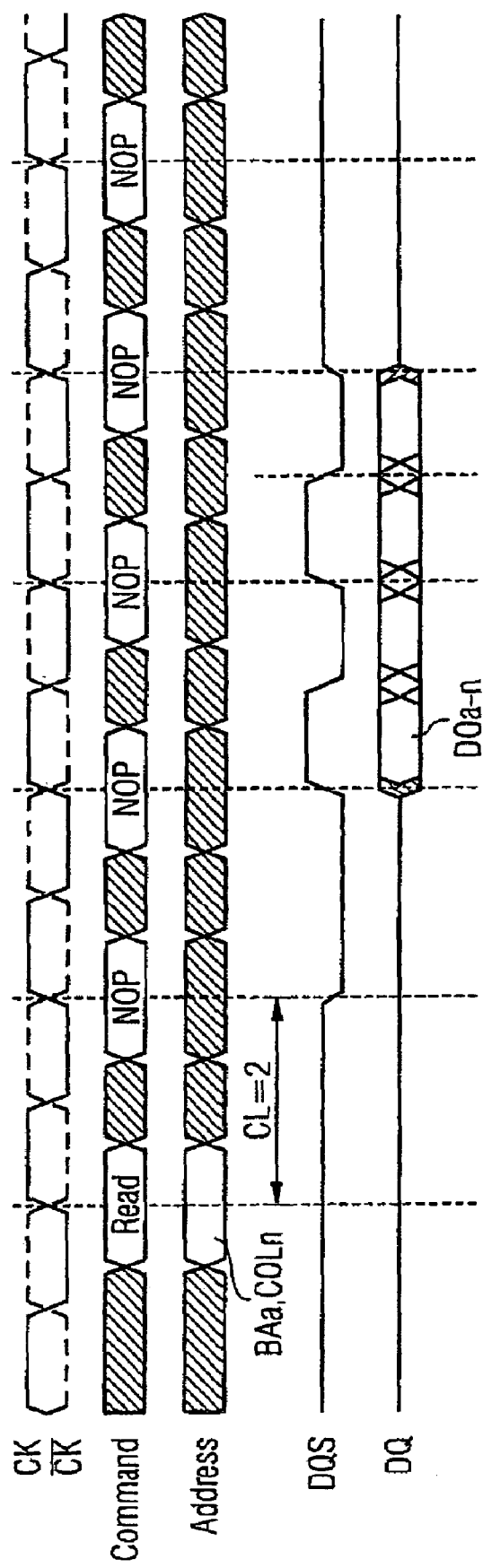
FIG. 6 is a timing diagram illustrating an overview of the temporal profile of a few drive signals according to one example of the invention.

FIG. 6 shows a schematic sequence of such a read process in the form of a few signal profiles. In this case, at a specific instant, a command signal "Read" is sent to the memory chip via a signal line. This signal indicates that a memory cell is intended to be read as the next action. Two address signals are simultaneously transferred, indicating a column and also a row of the memory cell to be read. After a latency CL, which amounts to two clock cycles CK in this case, the corresponding data signals are present at the output DQ.

Figure 2:
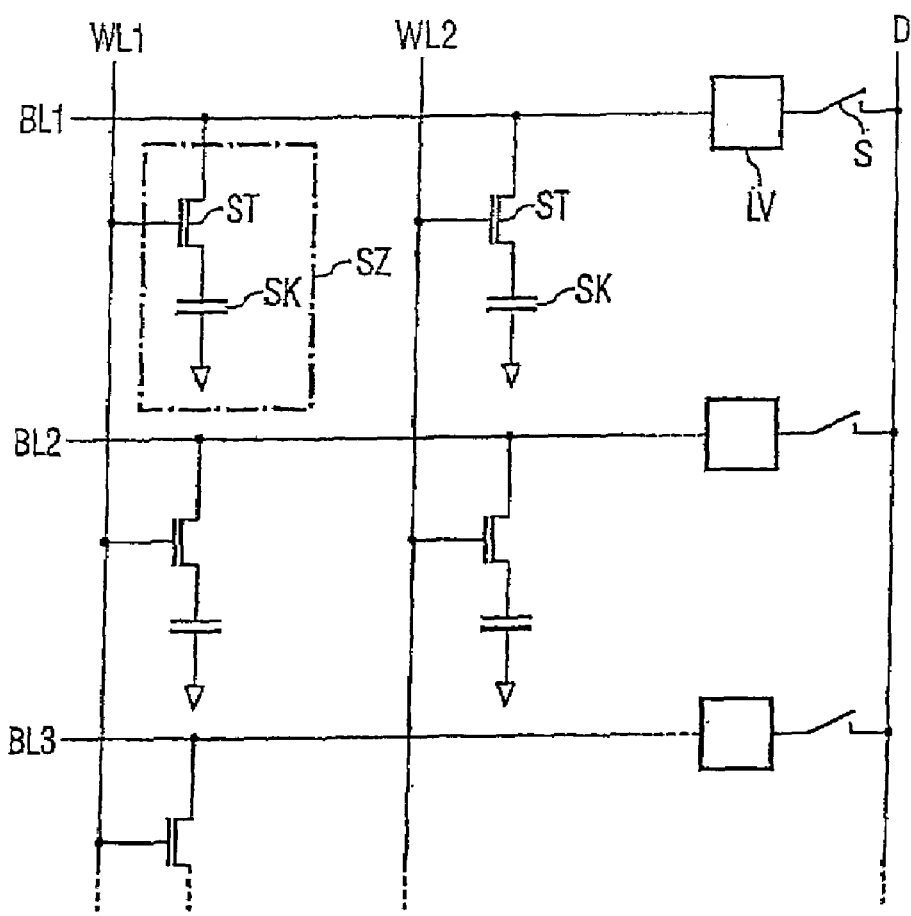
FIG. 2 is a schematic diagram illustrating a number of memory cells within a memory chip.

The address signals are converted internally on word lines and also bit lines. These represent the column and also the row of a memory cell in a memory cell array and thus open a specific memory cell of the memory chip. FIG. 2 shows a detail from such a memory cell array in a memory chip.

In this case, a gate terminal of a memory transistor ST is connected to each word line WL1 and WL2. One terminal of each transistor ST leads to a storage capacitor SK which, together with the memory transistor ST, forms a memory cell SZ. The other terminal of the transistor ST is connected to a respective bit line BL1, BL2 or BL3. The charge in the storage capacitors in comparison with a reference potential or a reference charge represents the logic value.

In order to read from one of these memory cells SZ, a signal is applied to one of the word lines, for example the word line WL1. All transistors connected to the word line WL1 are opened as a result. The charge present in the respective storage capacitors generates a specific potential on the respective bit lines. By activating one of the bit lines with a corresponding signal, the memory content of the memory cell is amplified by means of a sense amplifier LV connected to the bit line and is output on the data line D by means of switching of the switch S. The cell contents of all memory cells connected to the word line WL1 which are not read are written back to the storage capacitor again by means of the sense amplifiers assigned to them. By means of the addressing on the word line and also the bit line, it is possible to achieve an unambiguous assignment of a memory cell in a memory cell array of a memory chip. That is to say that a memory cell can be addressed by means of the word and bit lines.

Modern memory modules and corresponding memory control devices additionally have the possibility of error correction, referred to in English as "error correction code" (ECC). This error correction enables not only an unambiguous identification of a possibly defective individual memory cell within a memory chip of the entire memory module, but also a correction of the error.

For this purpose, from a set of bits to be read or to be written, a checksum is generated with the aid of a mathematical algorithm. A Hamming matrix is often used for this purpose. The checksum generated itself comprises a number of bits and is stored in a chip especially provided for this on the memory module by the memory controller. This is the memory chip designated by ECC in the memory module 1 of FIG. 3. This memory chip is structurally identical to the memory chips B1 to B8 since the error correction data do not differ from normal data. Only the processing of the data by the memory controller is effected differently.

Thus, by way of example, the memory control circuit generates a checksum comprising eight bits from a total of 64 bits to be stored in accordance with the algorithm used. The 64 bits to be stored are distributed between the eight memory chips B1 to B8 and written in parallel together with the eight checksum bits to the addressed memory cells of the memory chips. The eight checksum bits are stored in the memory chip for the error correction. In the case of a read-out of the 64 bits from the memory chips B1 to B8, the memory controller additionally also concomitantly reads out the eight bits of the error correction chip ECC. If the 64 bits of the memory chips B1 to B8 produce the same checksum as the checksum read from the error correction chip ECC, then no error is present. If said checksum is different, however, the controller returns a special error signal indicating an error correction event "EEC fail event".

In order to avoid further errors and to be able to implement corresponding measures, if appropriate, it is necessary to obtain the precise address within the memory chip. In a normal test program, it is possible to obtain the address of a defective memory cell in a memory chip B1 to B8 by comparison with reference data. However, if a memory cell within the error correction chip ECC is defective, then a precise identification of said memory cell is not possible since the memory controller only generates a corresponding error signal ECC fail event, but does not return the address of the memory cell of the error correction chip ECC. This lack of information makes an analysis of the reason for the error considerably more difficult.

Consequently, particularly in the case of dynamic errors which, by way of example, are also dependent on the data contents of adjacent memory cells, the knowledge and the precise data content of the individual memory cells within the error correction chip ECC are absolutely necessary. At the same time, the data written to the error correction chip should correspond as far as possible to those in the case of which the error occurs. This is expedient in particular when so-called soft errors are involved, that is to say errors which depend on external parameters such as potentials on word or bit lines and also the contents of adjacent memory cells.

Figure 1:
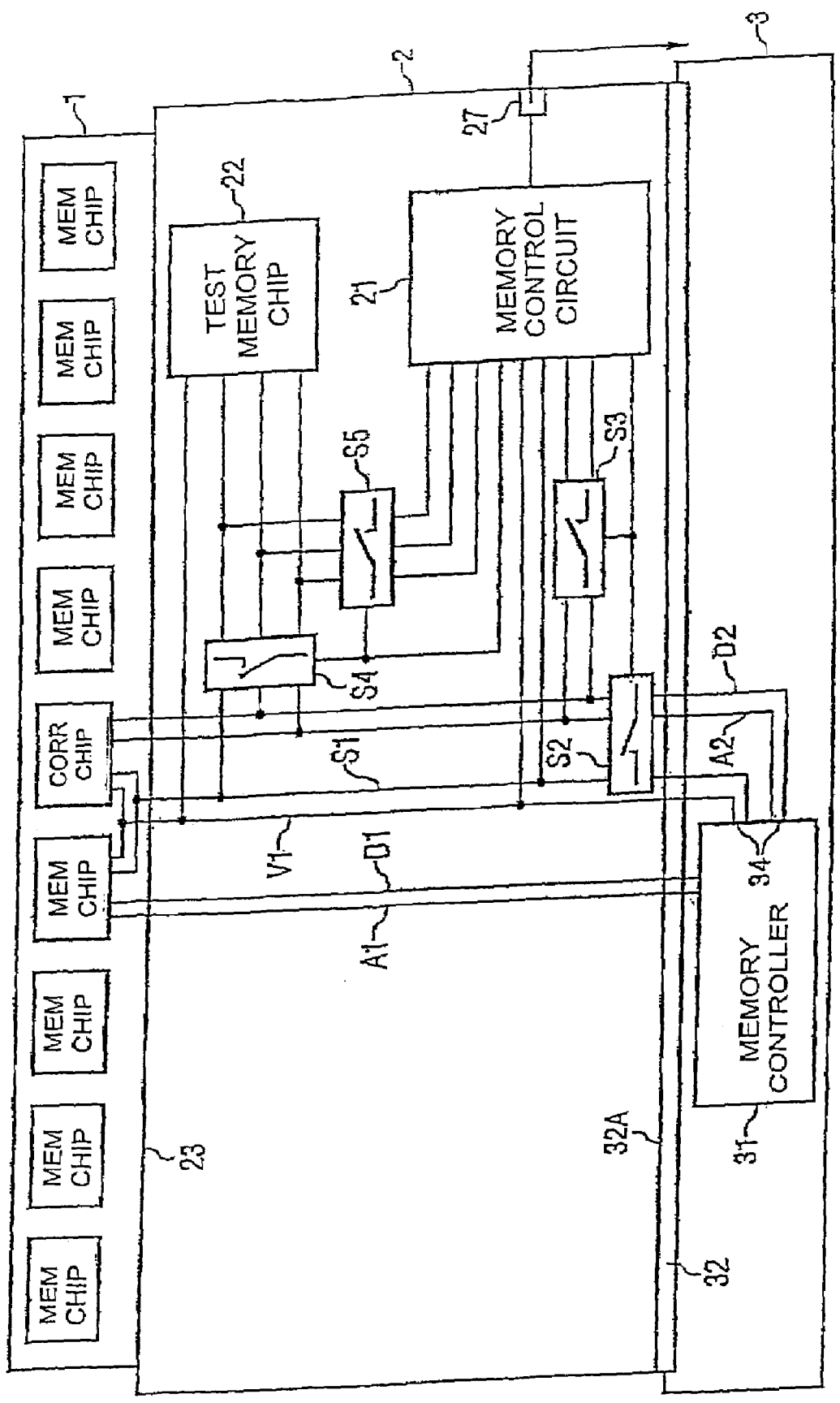
FIG. 1 is a block diagram illustrating a test card according to the invention, which is connected between a memory module slot of a computer system and a memory module.

FIG. 1 shows a test arrangement 2 in a computer system 3, which test arrangement can be used for determining such an address for a later analysis in an error correction chip on a memory module 1. In this case, the test arrangement is realized in the form of a stiff test card on which all the elements are arranged. This has the advantage that it can be used directly instead of the memory module. The computer system 3 contains a memory controller 31 with a multiplicity of terminals 34. The memory controller 31 reads from and writes to individual memory cells and thus data from and to memory chips of a memory module.

This is done by emitting corresponding control and check signals and also data signals on the lines connected to the memory controller 31. The control and check lines and also the data lines lead to an interface 32 having a multiplicity of individual pins. The latter are not illustrated here for reasons of clarity. Each individual one of said pins is connected to the memory controller 31 by means of a corresponding signal line.

The interface 32 is connected to a corresponding first interface 32A of a test card 2. Specifically, the interface 32 contains a female interface, while the first interface 32A of the test card 2 constitutes a male interface, by way of example. The interface 32A of the test card 2 cannot be discerned in FIG. 2 since it has been inserted and thus sunk in the interface 32 of the computer system. The interface 32 thus forms a memory module slot into which, instead of a corresponding memory module, the test card 2 is then inserted.

The test card 2 contains a multiplicity of connection pins for making electrical contact with the interface 32 and lines respectively connected thereto, a few of which are shown here. These lead to a second interface 23 on the opposite side of the test card 2, which, for its part, is formed as a female memory module slot. It is similar or even structurally identical to the slot 32 of the computer system 3. The actual memory module 1 is inserted into the second interface 23. The test card 2 leads the individual pins of the memory module 1, which are illustrated in FIG. 3, to the corresponding connection contacts of the first interface 32A and thus of the memory module slot 32. The test card 2 enables error-free and correct operation of the memory module 1 if the memory controller 31 of the computer system 3 drives the memory module 1.

For reasons of clarity, the exemplary embodiment illustrated here shows only some of the address lines, data lines, supply lines and also control lines for the individual memory chips for driving. Thus, by way of example, the memory controller 31 is connected via an address line A1 and also a data line D1 to a memory chip B4 of the memory module 1 via the test card 2. Control and data lines are illustrated as a single line here, but it is also possible, depending on the embodiment, to provide a plurality of parallel data and address lines per memory chip.

Furthermore, a supply line V1 and also a chip select line S1 lead to the memory chips B4 and the error correction chip ECC. For address and data communication of error correction data to the error correction chip ECC, the memory controller 31 likewise contains a further address line A2 and also a data line D2. The data line is connected to the respective connection pins of the memory module slot 32 and 32A, which are in turn electrically coupled to the corresponding lines on the test card 2. The control line A2 and D2 is connected to the corresponding error correction chip ECC of the memory module 1. The chip select line S1 and the supply line V1, which ensures the current and voltage supply of the individual chips, are also connected to the error correction chip ECC.

The test card 2 furthermore contains a semiconductor memory 22 and also a further memory control circuit 21. The memory control circuit is likewise connected to the supply line V1 and also the chip select line S1. Via a switching device S3, it is additionally connected to the address line A2 and also the data line D2 for the error correction chip ECC. It is thus connected via the switch S3 to the corresponding pins of the interface 23 of the test card 2. Furthermore, the memory control device 21 is connected via a switch S5 to the data line, the address line and also the chip select line S1 for the semiconductor memory 22.

Two further switches S2 and S4 are additionally provided. The switch S2 is connected between the first and second interfaces of the test card 2, and more precisely between the chip select line S1, address line A2 and data line D2. The switch S4 connects select line S1, data line D2 and address line A2 of the error correction chip ECC to the test memory chip 22. All four switches S2 to S5 are connected to the control circuit 21 via corresponding control lines. This enables the control circuit 21 to effect a selective disconnection or connection of individual lines provided for communication with the error correction chip ECC. In this context, it is also possible, in particular, for the switch S2 to be connected only into the address line A2 and the data line D2 for the error correction chip ECC. Finally, an output interface 27 is provided, via which the memory controller 21 can supply data to a test program. The interface may be formed as a serial or parallel interface.

The test memory chip 22 contains a variety of elements. By way of example, it has a first memory that is very fast but comprises only few memory cells, and a second memory connected thereto that is slow but comprises very many memory cells. This design variant enables a significantly faster test mode and a more cost-effective design of the second test card 2. In particular, it is thus possible to buffer-store error correction data in fast memories if a corresponding test mode that envisages alternate read and memory accesses to the error correction chip ECC has been selected.

In the design of the test card 2, however, care must be taken to ensure that the corresponding data and signal lines have a specific length that is fixedly defined with respect to one another. This is necessary in order to avoid corresponding latencies and thus to prevent automatic data losses or errors occurring. By way of example, it is expedient to configure the line connections between the test memory chip 22 and the tap onto the select line S1, the address line A2 and the data line D2 with the same length corresponding to a length from the respective tap to the error correction chip ECC on the memory module 1. The signal lines for the memory controller 21 on the test card 2 also have to be formed in the same way. In addition, it is likewise expedient for all signal lines to be configured as short as possible in order thus to minimize coupled-in interference or attenuations on the signal lines.

For a test of the individual memory cells in the memory chips of the module 1, the switch S2 is closed by the control device 21. Consequently, all memory chips of the memory module 1 are connected to the control device 31. The memory controller 31 then receives from the processor or some other device data which it is intended to write to the memory cells of the individual memory chips of the module 1.

Figure 4:
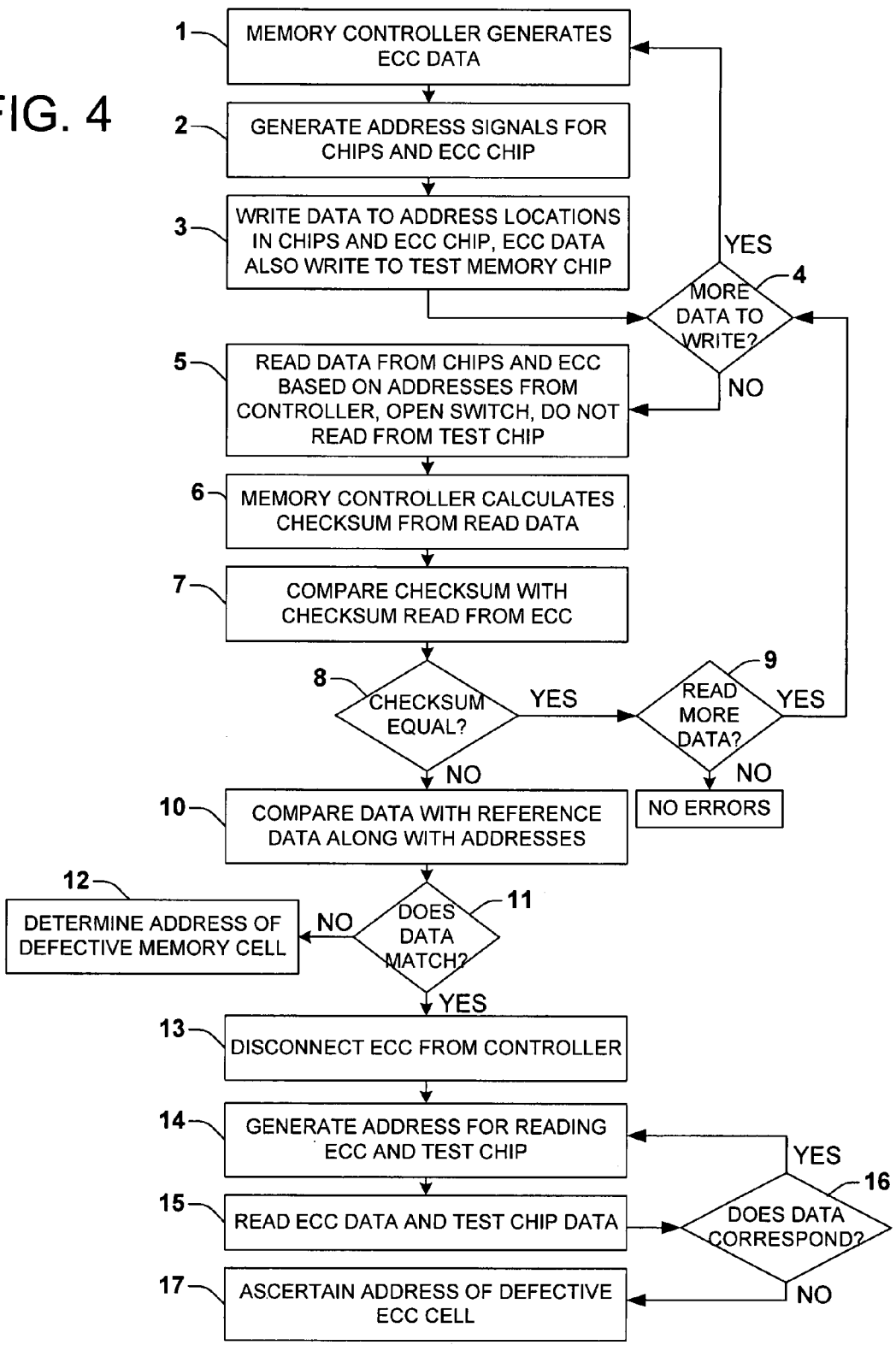
FIG. 4 is a flow chart diagram illustrating a method according to another embodiment of the invention.
Figure 5:
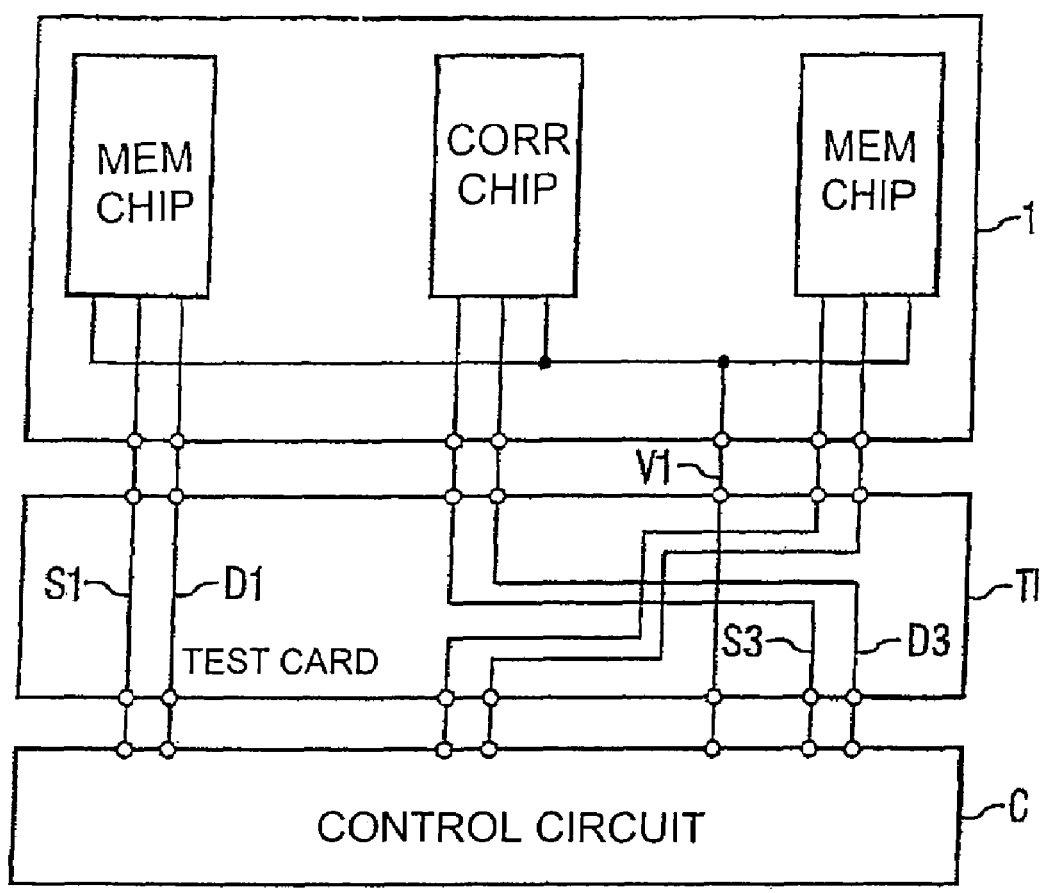
FIG. 5 is a prior art block diagram illustrating a test card.

FIG. 4 shows an overview of a corresponding test method by means of which the individual memory cells and also the memory cells of the error correction chip ECC can be tested with regard to their functionality. For this purpose, a test program is executed on a computer system containing a test card according to the invention. In the case of an error, it is thus possible to determine a precise address on all the chips, so that a more precise analysis later is possible. The reference data communicated to the memory controller by the test program are known and may thus also be used for later comparisons.

From the data communicated, the memory controller 31 generates error correction data in step 1 of the method according to the invention. Said error correction data enable not only a precise identification of an incorrect or toggled bit, but also a correction thereof. It is even possible to identify a plurality of incorrect bits given a suitable algorithm for generating the error correction data. This is referred to as SECDED "single error correction, double error detection". In one exemplary embodiment, the memory controller 31 generates 32 error correction bits from a total of 256 bits to be written. Said 256 bits form a cacheline which is written to the memory or read from the latter together with the correction bits. A write process or a read process is effected during a so-called burst cycle, having the length 4 in the exemplary embodiment. This means that the memory controller 31 in each case reads or writes 64 bits of data and the 8 assigned check bits in four cycles. The length of the burst is 2, 4 or 8 depending on the specification.

Most memory controllers write the data in parallel to individual memory cells of the memory chips B1 to B8 on the memory module 1. In this embodiment, the memory controller 31 thus waits until it contains a sequence of 256 bits for storage in the memory cells. It generates therefrom 32 error correction bits and, in step 2 of the method according to FIG. 4, a corresponding addressing of the memory cells of each memory chip.

Step 2 thus involves the generation of the address signals for a respective memory cell on one of the memory chips B1 to B8 and also the error correction chip ECC. The address signals are required for opening the corresponding memory cells by driving the word and bit lines identifying the memory cells.

In step 3, a datum is then written to the respective memory cell of the memory chips B1 to B8. In this case, the corresponding memory chips B1 to B8 and the error correction chip ECC and also individual memory banks possibly situated therein are selected by means of the chip select lines S1. A corresponding control signal "Write" is output by the memory controller 31. This signal opens the addressed memory cells of all of the memory chips and prepares them for the subsequent process of writing the cacheline. After the cacheline has been written, the individual memory cells of the memory chips B1 to B8 are closed again.

In the same way, the error correction data are also simultaneously written to the error correction data chip. In this case, too, a corresponding command "Write" is effected via the address line A2 and the chip select line S1 to the error correction chip ECC. The command for the write process of the error correction chip ECC is registered by the control circuit 21, however, which thereupon closes the switch S4 and thus connects the test memory chip 22 to the signal lines S1, S2 and D2. The process of storing the error correction data in the error correction chip is thus also effected by means of a corresponding addressing of memory cells in the auxiliary memory 22.

Consequently, the error correction data are stored not only in the error correction chip on the memory module 1, but also in the test memory chip 22. This is all the more advantageous as the same address data are available for the error correction chip ECC and also the test memory chip 22.

Thus, step 3 of the embodiment of the method likewise involves writing to the test memory chip 22 at a defined address which is assigned to the corresponding write address on the error correction chip ECC.

After a process of writing to the memory chips B1 to B8 and also the error correction chip ECC, it is possible to decide whether further data are present for a write process or whether the written cacheline is intended to be read. If further data are present, a jump is made from step 4 of the method according to the invention back to step 1. Otherwise, a process of reading the written cacheline is effected in step 5.

For this purpose, the memory controller 31 determines the addresses required for the cacheline to be read. The actual read process is output to the memory chips via the control lines by means of a corresponding preparation command "Read". The addresses communicated open the word and bit lines of the memory chips B1 to B8, so that the data content of the assigned memory cell can be read out.

At the same time, the error correction chip ECC is also read. For this purpose, the memory control device 31 likewise outputs a corresponding command "Read" to the error correction chip via the control line. The control device 21 on the test card 2 identifies this command and opens the switch S4. As a result, the data, address and control lines of the auxiliary memory chip 22 are disconnected from the control lines for the error correction chip ECC on the test memory module 1.

This is necessary if the returned data of the error correction chip do not correspond to the data on the auxiliary memory. If the memory cells of both memories were read, in the case of different data an average value could result on the data line. The behavior of comparison circuits within the memory controller 31 in such a case is not known. It can happen, therefore, that a possible error is not identified on account of incorrect evaluation. For this reason, the switch S4 is always disconnected from the corresponding lines in the case of a read process on the error correction chip ECC.

Overall, then, an entire cacheline comprising the 256 data bits plus the 32 error correction bits is read by the memory controller in step 5.

In step 6 of the method in accordance with FIG. 4, the memory controller generates a checksum from the memory cells of the memory chips B1 to B8. This checksum is compared with the checksum read from the error correction chip in step 7. As an alternative, it is also possible, of course, to use other methods in order to check the 256 data bits read for possible errors. The individual methods may differ with regard to their speed and procedure.

If the two checksums correspond, then a check may be made in step 9 to ascertain whether further data are intended to be read from the memory module 1. If this is the case, the method is continued at step 4. If further data no longer have to be read and if no error has occurred, the memory module can be regarded as free of errors.

However, if the checksum calculated from the data read, in step 8, does not correspond to the checksum generated from the error correction bits, the memory controller 31 generates a corresponding signal "ECC fail event" indicating a correction error. This signal is communicated to the processor and thus also to a test program that is executed on the processor. This therefore indicates to the processor that the following data are erroneous. The processor can thus decide whether it requests the data anew or terminates the calculation and outputs an error.

If appropriate, the memory controller 31 can carry out an error correction. This is not expedient, however, if the defective memory cell is to be identified and a precise error analysis is to be carried out.

After the communication of an "ECC fail event" indicating an erroneous checksum, in step 10 the test program compares the 16 bits of the cacheline that has been read with the known reference data. In this case, the specific addresses of the memory cells read on the memory chips of the memory module 1 are also communicated, inter alia, to the test program. The result of this comparison of the data read with the reference data leads to the decision in step 11 of the method.

If the data read do not correspond to the reference data, the address of the defective memory cell is determined by the test program in step 12. This may be used for further analysis methods. By contrast, if the data read correspond to the reference data, there must be an error within a memory cell of the error correction chip ECC. However, the memory controller 31 does not output the address of the error correction data on the error correction chip ECC. Therefore, an address of the defective memory cells within the error correction chip is unknown.

In such a case, in step 13 the further program sequence is then stopped and a special test operating state of the test card 2 is activated by the test program. This may be effected via the output interface 27, for example, via which the controller 22 is activated.

As a result of the activation, via the switching device S2 on the test card 2, the controller 21 disconnects the chip select line S1 and the address lines A2 and D2 via the switching device S2. As a result, the error correction chip ECC on the memory module 1 is disconnected from the chip controller 31 in the computer system. At the same time, the switch S4 is also opened and the switches S3 and S5 are closed. The memory controller 21 is now connected via data, address and control lines to the auxiliary memory 22 and also the error correction chip ECC on the memory module 1. At the same time, the auxiliary memory 22 is disconnected from the second interface 23 of the test card 2.

In step 14, the memory controller 21 then generates an address for reading from the memory cells on the error correction chip ECC and the auxiliary memory 22. Since there was a fixed assignment between the addresses of the error correction chip ECC and the test memory chip 22 during the write process, it is now possible to determine the precise address of the defective memory cell on the chip ECC by reading out and comparing a datum in the memory cells. For this purpose, after the generation of an address, a corresponding command "Read" is output on the control lines to the error correction chip ECC and the test memory chip 22.

With the communicated address lines, the command opens the assigned memory cells on the error correction chip ECC and the test memory chip 22, which are thus read in step 15. A simple comparison circuit within the control device 21 enables a comparison of the data of the memory cells read. If these two data correspond, said memory cell is not defective. The method then continues with addressing of a new memory cell.

However, if the comparison reveals no correspondence between the data, then an address of the error correction chip ECC can be unambiguously determined on account of the fixed assignment of the known address of the test memory chip 22 to the error correction chip ECC. Finally, the method is continued in step 9 after the outputting of the address of the defective memory cell via the interface 27 to the test program within the error correction chip ECC. In this case, a decision is again made as to whether a complete test has already been carried out or the test routine is intended to proceed further.

The method illustrated here can be implemented in various ways. It is thus expedient, by way of example, when only one cacheline in each case is written and this cacheline is subsequently read, to provide only a small memory with few memory cells as test memory chip 22. Space and costs can thereby be reduced.

A dynamic error on the error correction chip may have a number of causes. Thus, it is entirely conceivable, for example, that an error occurs only under specific preconditions, for example as a result of a defined potential distribution in adjacent memory cells. It may therefore be necessary not just to write and read one cacheline, but rather to write error correction data to the complete error correction chip. The test memory chip must have an appropriate size in such a case. However, since some clock cycles are available between the processes of writing the error correction data, it may be expedient to provide a small, very fast memory with few memory cells which is connected to a large but slow memory. When writing relatively large quantities of data, enough time nevertheless remains for writing the data from the fast memory to the slow memory by virtue of the additional clock cycles. The auxiliary memory must therefore contain enough space for the error correction data.

In addition, it may be expedient for the memory control device 21 to buffer-store the address of an area that has already been addressed and written to by the memory controller 31. The addressed area can thus be specifically interrogated in the case of an "ECC fail event" occurring. The test method is thereby accelerated overall.

The test card illustrated here enables ongoing operation with an operating system while a test phase is proceeding simultaneously. In particular, it is possible to implement a normal test program for a computer system in ongoing operation. By way of example, if the computer system has a plurality of memory slots with memory modules introduced therein, the test program proceeds within one of said memory modules. The memory module 1 to be checked is inserted into a further memory slot via the test card 2. The test program can then write data to the memory module and thus check the error correction chip ECC for functionality.

The additional interface 27 at the test card 2 enables the memory controller 21 to output an erroneous address within the error correction chip ECC. Moreover, it can serve for controlling the memory controller. The driving may be effected by means of a test program, as in the example, but also by means of a second computer or a dedicated test system. Of course, the test card can be used not just for testing an error correction chip ECC. In particular, checksum data that do not enable error correction can also be analyzed and tested by means of the method presented here. Through suitable interconnection, moreover, the address and signal lines of all the memory chips of a module can be coupled to the auxiliary memory. The method can thus also be applied to other memory chips.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A test arrangement for an error analysis of at least one memory chip of a memory module, comprising:
   a first interface configured to couple to a memory module slot of a computer system;
   a second interface configured to couple to a memory module comprising a first memory chip and at least one second memory chip, the first and the at least one second memory chip of the memory module comprising a plurality of addressable memory cells;
   a test memory chip comprising a plurality of addressable memory cells;
   a control device coupled to the first and the second interface and to the test memory chip;
   a first switching device controlled by the control device, and configured to selectively couple the test memory chip to the second interface; and
   a second switching device controlled by the control device and connected between the first interface and the second interface;
   wherein the control device is further configured to dictate a first operating state, wherein the second switching device is activated and data is written to memory cells of the first memory chip, and to memory cells of the test memory chip and, wherein the control device is configured to dictate a second operating state, wherein the first switching device is activated and data from the memory cells of the first memory chip is compared with the data from the memory cells of the test memory chip.

2. The test arrangement of claim 1, wherein the control device is further configured to, in the first operating state, read data from memory cells of the first memory and concurrently suppress reading data from memory cells of the test memory chip.

3. The test arrangement of claim 1, further comprising a connection-correct coupling comprising at least one signal line by which at least one connection pin of the first interface is coupled to at least one corresponding connection pin of the second interface for driving the first memory chip.

4. The test arrangement of claim 3, wherein the connection-correct coupling further comprises connecting signal lines between the first interface and the second interface for the driving of the at least one second memory chip.

5. The test arrangement of claim 3, wherein the test memory chip is coupled to the at least one signal line, and wherein the at least one signal line is configured to exchange error correction data between the first interface and the second interface.

6. The test arrangement of claim 5, wherein the first switching device is configured to, in the first operating state, connect the test memory chip to the second interface during a write process, and interrupt connection of the auxiliary memory chip to the second interface in a read process.

7. The test arrangement of claim 1, wherein the first interface and the second interface are configured to supply error correction data.

8. The test arrangement of claim 1, wherein the second switching device is configured to, in the first operating state, connect the first interface to the second interface and, in the second operating state, interrupt connection between the first interface and the second interface.

9. The test arrangement of claim 1, wherein the control device is connected to a control signal line and configured to monitor a read or write process based on a signal on the control signal line.

10. The test arrangement of claim 1, wherein the control device is coupled to the second interface via a third switching device that is regulated by the control device.

11. The test arrangement of claim 10, wherein the control device is further coupled to the at least one signal line.

12. The test arrangement of claim 10, wherein the third switching device is configured to, in the first operating state, connect the control device to the second interface and, in the second operating state, disconnect the control device from the second interface.

13. The test arrangement of claim 1, wherein the control device and the test memory chip are coupled to one another via a fourth switching device.

14. The test arrangement of claim 13, wherein the fourth switching device is configured to, in the first operating state, interrupt the connection between the control device and the test memory chip and, in the second operating state, connection the control device to the test memory chip.

15. The test arrangement of claim 1, wherein the test arrangement further comprises an output interface coupled to the control device and configured to output error addresses from and supply control signals to the control device.

16. The test arrangement of claim 1, wherein the control device and the test memory chip are arranged on the test arrangement.

17. The test arrangement of claim 1, wherein the test arrangement comprises a stiff test card.

* * * * *